(12) United States Patent
Ma et al.

(10) Patent No.: US 11,175,442 B2
(45) Date of Patent: Nov. 16, 2021

(54) COLOR FILTER SUBSTRATE AND DISPLAY PANEL

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Chunhong Ma, Beijing (CN); Baojie Zhao, Beijing (CN); Wei Wang, Beijing (CN); Xiongwei Wang, Beijing (CN); Xiang Hui, Beijing (CN); Yan Zhao, Beijing (CN); Yanbin Zhang, Beijing (CN); Li Wang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 220 days.

(21) Appl. No.: 16/450,108

(22) Filed: Jun. 24, 2019

(65) Prior Publication Data

US 2020/0096685 A1 Mar. 26, 2020

(30) Foreign Application Priority Data

Sep. 26, 2018 (CN) .......................... 201811124882.7

(51) Int. Cl.
*G02B 5/20* (2006.01)
*G02F 1/1339* (2006.01)
(Continued)

(52) U.S. Cl.
CPC .......... *G02B 5/201* (2013.01); *G02F 1/1339* (2013.01); *G02F 1/136209* (2013.01); *G03F 7/0007* (2013.01); *G02F 1/136222* (2021.01)

(58) Field of Classification Search
CPC ....... G03F 7/0007; G02B 5/201; G02B 5/223; G02F 1/133512; G02F 1/133514; G02F 1/133516; G02F 1/1339; G02F 1/13394
(Continued)

(56) References Cited

U.S. PATENT DOCUMENTS

2015/0131025 A1* 5/2015 Ota .................. G02F 1/133512
349/58

FOREIGN PATENT DOCUMENTS

CN 103149729 A 6/2013
CN 104166270 A 11/2014
(Continued)

OTHER PUBLICATIONS

First Office Action dated Nov. 13, 2020 for application No. CN201811124882.7 with English translation attached.

*Primary Examiner* — John A McPherson
(74) *Attorney, Agent, or Firm* — Nath, Goldberg & Meyer; Joshua B. Goldberg

(57) ABSTRACT

The present disclosure provides a color filter substrate and a display panel. The color filter substrate is divided into a display region and a non-display region around the display region, and includes a base and a color filter layer on the base. The color filter layer includes a plurality of columns of color resists arranged at intervals, any two adjacent columns of color resists in the display region define one of a plurality of first openings, any two adjacent color resists in the non-display region define one of a plurality of second openings, and a width of an orthographic projection of the second opening on the base is greater than a width of an orthographic projection of the first opening on the base.

13 Claims, 3 Drawing Sheets

(51) Int. Cl.
*G02F 1/1362* (2006.01)
*G03F 7/00* (2006.01)

(58) Field of Classification Search
USPC .............................................. 430/7; 349/106
See application file for complete search history.

(56) References Cited

FOREIGN PATENT DOCUMENTS

| CN | 104570455 A | 4/2015 |
| CN | 104730756 A | 6/2015 |

\* cited by examiner

COLOR FILTER SUBSTRATE AND DISPLAY PANEL

CROSS-REFERENCE TO RELATED APPLICATIONS

The present application claims the priority of Chinese Patent Application No. 201811124882.7 filed on Sep. 26, 2018, the contents of which are incorporated herein in by reference.

TECHNICAL FIELD

The present disclosure relates to the field of display technology, and in particular to a color filter substrate and a display panel.

BACKGROUND

Liquid crystal display panels have the advantages of being light and thin and saving power, and thus have been widely applied. A liquid crystal display panel is mainly composed of an array substrate, a color filter substrate and a liquid crystal layer disposed therebetween, and works on a principle that the two substrates are applied with driving voltages to control rotation of liquid crystal molecules of the liquid crystal layer, so as to refract light from a backlight module to produce images.

In an existing liquid crystal display panel, black matrices are usually arranged on a side of the color filter substrate in order to prevent light leakage. The black matrices in a display region of the liquid crystal display panel and the black matrices in a peripheral region around the display region are arranged in different ways, so that a black matrix layer in the display region is provided with openings while a black matrix layer in the peripheral region is not provided with openings. As a result, a cell thickness in the peripheral region is greater than that in the display region in the liquid crystal display panel, which easily leads to display defects in the peripheral region.

SUMMARY

One aspect of the present disclosure provides a color filter substrate which is divided into a display region and a non-display region around the display region, and includes a base and a color filter layer on the base. The color filter layer includes a plurality of columns of color resists arranged at intervals, any two adjacent columns of color resists in the display region define one of a plurality of first openings, any two adjacent columns of color resists in the non-display region define one of a plurality of second openings, and a width of an orthographic projection of the second opening on the base is greater than a width of an orthographic projection of the first opening on the base.

According to embodiments of the present disclosure, the color resists in a same column are integrally formed; and in a row direction, a gap between any two adjacent columns of color resists in the display region defines the first opening, and a gap between any two adjacent columns of color resists in the non-display region defines the second opening.

According to embodiments of the present disclosure, the color resists in a same column are integrally formed; and in a row direction, a gap between any two adjacent columns of color resists in the display region defines the first opening, a gap between any two adjacent columns of color resists in the non-display region defines a first sub-opening, each color resist in the non-display region is provided with a second sub-opening, and each first sub-opening and one second sub-opening adjacent thereto form the second opening.

According to embodiments of the present disclosure, the first sub-openings and the first openings which are in a same column have a same size.

According to embodiments of the present disclosure, the second sub-openings in a same column are integrally formed.

According to embodiments of the present disclosure, slots in the color resists in the non-display region define the second sub-openings.

According to embodiments of the present disclosure, the color filter substrate further includes a black matrix layer between the base and the color filter layer.

According to embodiments of the present disclosure, the color filter substrate further includes a planarization layer located on a side of the color filter layer away from the base.

The other aspect of the present disclosure provides a display panel including the color filter substrate according to the present disclosure.

DETAILED DESCRIPTION

In order to enable those of skilled in the art to better understand the technical solutions of the present disclosure, the present disclosure will be described in detail below in conjunction with specific embodiments and drawings.

Figure 1:
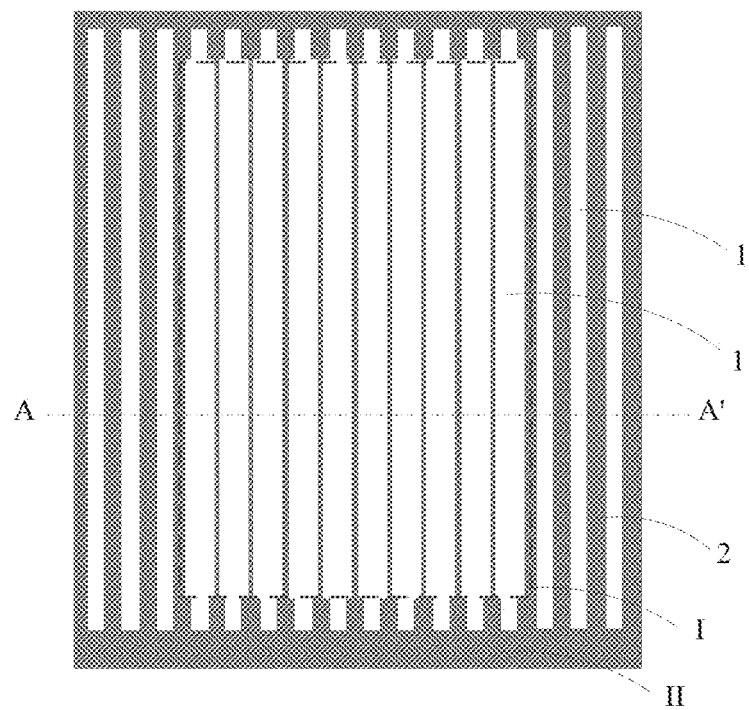
FIG. 1 is a schematic structural diagram of a color filter substrate according to an embodiment of the present disclosure.
Figure 2:
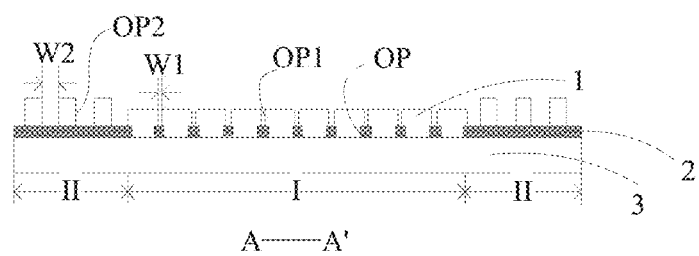
FIG. 2 is a cross-sectional view taken along a line AA' of FIG. 1.

FIG. 1 is a schematic structural diagram of a color filter substrate according to an embodiment of the present disclosure, and FIG. 2 is a cross-sectional view taken along a line AA' of FIG. 1.

As shown in FIGS. 1 and 2, a color filter substrate according to the embodiment of the present disclosure may be divided into a display region I (a region surrounded by a dotted line in FIG. 1) and a non-display region II around the display region I. The color filter substrate includes a base 3, a black matrix layer 2 on the base 3, and a color filter layer.

With reference to FIG. 1, a display substrate may be in a rectangular shape, the display region I is located in a central area of the display substrate and may also be in a rectangular shape, and the non-display region II surrounds the display region I and is located in a peripheral area of the display substrate.

With reference to FIG. 2, the black matrix layer 2 in the display region I includes a plurality of openings OP which define a plurality of pixel units, and may be arranged in an array corresponding to the pixel units. The black matrix layer 2 in the non-display region II is not provided with openings in order to prevent light leakage of the display substrate in a display process.

The color filter layer includes a plurality of columns of color resists 1 arranged at intervals. Each column of color resists 1 in the display region I is corresponding to a column of pixel units, that is, each column of color resists 1 in the display region I is corresponding to and covers a column of openings OP in the black matrix layer 2. Colors of the color resists 1 may include red, green and blue, and the color resists 1 in the three different colors are alternately arranged so that three color resists 1 in different colors, which are arranged adjacent to one another, form a pixel group. The color resists 1 in a same column may be in a same color or different colors. The embodiment is explained by taking an example that the color resists 1 in a same column are in a same color.

The color filter substrate further includes a planarization layer 4 (see FIG. 5), which is located on a side of the color filter layer away from the base 3 for realizing planarization of the color filter substrate.

In the color filter substrate according to the embodiment, any two adjacent columns of color resists 1 in the display region I define one of a plurality of first openings OP1, any two adjacent columns of color resists 1 in the non-display region II define one of a plurality of second openings OP2, and a width W2 of an orthographic projection of the second opening OP2 on the base 3 is greater than a width W1 of an orthographic projection of the first opening OP1 on the base 3, so that a surface of the planarization layer 4 on the color filter layer, which is away from the base 3, is flat.

With reference to FIG. 2, the first opening OP1 may be defined by a gap between any two adjacent columns of color resists 1 in the display region I, and the second opening OP2 may be defined by a gap between any two adjacent columns of color resists 1 in the non-display region II.

Each column of color resists 1 in the color filter layer may include a plurality of color resists 1, that is, the color resists in the color filter layer are arranged as a whole in an array, and the color resists 1 in the display region I are in one-to-one correspondence with the pixel units. The color resists 1 in the non-display region II may be in a same shape as that of the color resists 1 in the display region I, and may have an area less than that of the color resists 1 in the display region I that is, it is possible to reduce a line width of the color resists 1 in the non-display region II, so as to make the width W1 of the gap between the adjacent color resists 1 in the display region I less than the width W2 of the gap between the adjacent color resists 1 in the non-display region II.

The color filter layer filters light by use of the color resists 1 in the different colors. Though the non-display region II is not configured to perform a display function, the color filter layer is provided in the non-display region II for supporting a cell thickness. In related art, the color resists 1 in the non-display region II and the color resists 1 in the display region I are arranged in a same way, but the black matrix layer 2 in the non-display region II are not provided with openings while the black matrix layer 2 in the display region I are provided with openings. Therefore, under the condition that the color filter layer in the display region I and the color filter layer in the non-display region II have a same structure, a height in the non-display region II is greater than that in the display region I even though the color filter substrate is provided with the planarization layer 4, which produces a result that the cell thickness in the non-display region II is greater than that in the display region I after the display panel is assembled.

According to the embodiment, the color filter layer is modified in such a way that the second openings in the color filter layer in the non-display region are larger than the first openings in the color filter layer in the display region, that is, a ratio of opening volume in the color filter layer in the non-display region is greater than that in the color filter layer in the display region, so that part of a planarization material may be filled in the first and second openings in a process of preparing the planarization layer by coating, so as to reduce a thickness of the planarization layer in the non-display region, thereby reducing layer thicknesses of the color filter substrate in the non-display region in general, making an overall layer thickness of the color filter substrate more uniform, and improving cell thickness uniformity of the display panel after being assembled.

According to the embodiment of the present disclosure, as shown in FIG. 1, the color resists 1 in the same column are integrally formed; and in a row direction, a gap between any two adjacent columns of color resists 1 in the display region I defines the first opening OP1, and a gap between any two adjacent columns of color resists 1 in the non-display region II defines the second opening OP2.

As shown in FIG. 1, the color resists 1 in the same column form a color resist strip, and a plurality of color resist strips are arranged in the row direction. Since the non-display region II surrounds the display region I, all of the color resist strips located in the peripheral area of the color filter substrate in the row direction consist of the color resists 1 in the non-display region II and have a rectangular shape. The color resist strips located in the central area of the color filter substrate in the row direction include the color resists 1 in the non-display region II and the color resists 1 in the display region I; and since the line width of the color resists 1 in the non-display region II is less than that of the color resists 1 in the display region I, widths of two ends of the color resist strip are less than a width of a middle portion of said color resist strip in the row direction.

In a process of fabricating the color filter substrate, there are few requirements for opening sizes of masks, so that the requirements are easily met, which improves a yield of the color filter substrate. Furthermore, in the process of fabricating the color filter substrate according to the embodiment of the present disclosure, it only needs to reduce openings corresponding to the non-display region (that is, reducing the line width of the color resists in the non-display region II), which simplifies the fabrication process of the color filter substrate as much as possible.

Figure 3:
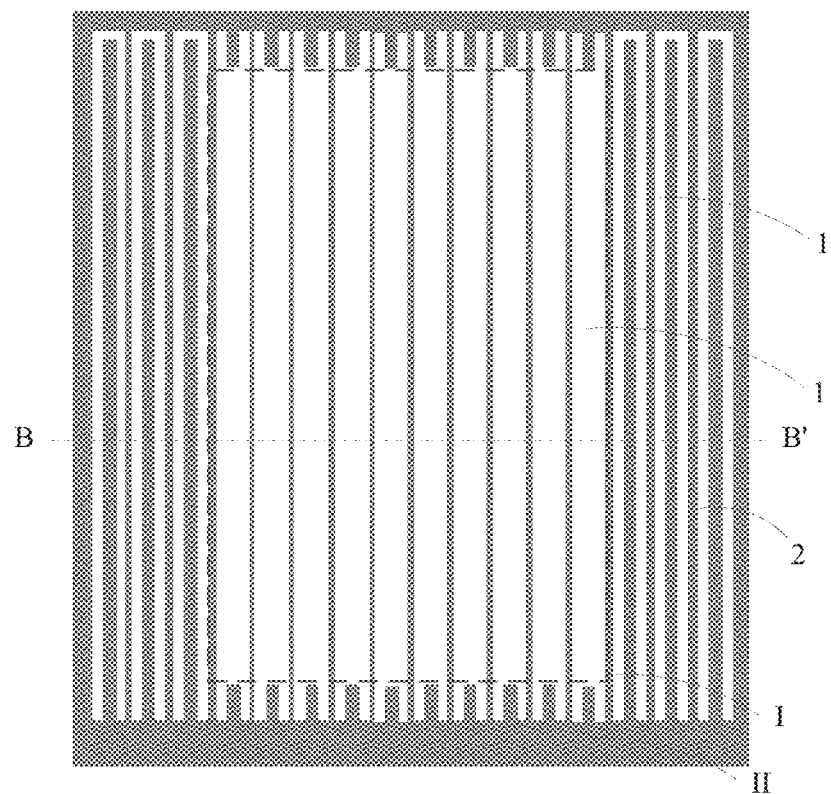
FIG. 3 is a schematic structural diagram of a color filter substrate according to an embodiment of the present disclosure.
Figure 4:
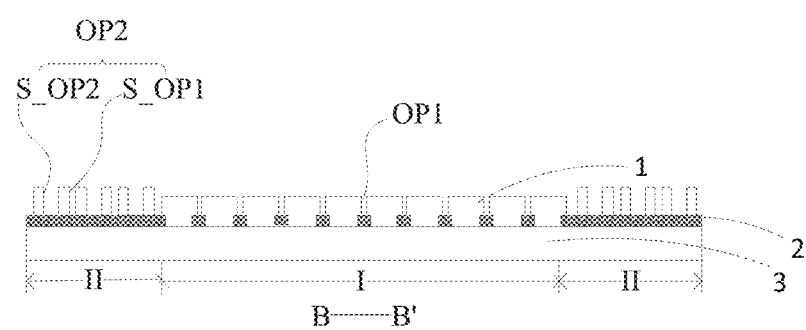
FIG. 4 is a cross-sectional view taken along a line BB' of FIG. 3.

FIG. 3 is a schematic structural diagram of a color filter substrate according to an embodiment of the present disclosure, and FIG. 4 is a cross-sectional view taken along a line BB' of FIG. 3.

As shown in FIGS. 3 and 4, the color filter substrate according to the embodiment is different from the color filter substrate according to the embodiment described by referring to FIGS. 1 and 2 in a shape of the color resist 1 formed in the non-display region II.

In the embodiment, the first opening OP1 is defined by a gap between any two adjacent columns of color resists 1 in the display region I, and the second opening OP2 is defined by a gap between any two adjacent columns of color resists 1 in the non-display region II and a slot of one color resist 1 in the non-display region II.

As shown in FIGS. 3 and 4, the color resists 1 in the same column are integrally formed; and in a row direction, the gap between any two adjacent columns of color resists 1 in the display region I defines the first opening OP1, the gap between any two adjacent columns of color resists 1 in the non-display region II defines a first sub-opening S_OP1, each color resist 1 in the non-display region II is provided with a second sub-opening S_OP2, and each first sub-opening S_OP1 and one second sub-opening S_OP2 adjacent thereto form the second opening OP2.

As shown in FIG. 3, the color resists 1 in the same column form a color resist strip, and a plurality of color resist strips are arranged in the row direction. Since the non-display region II surrounds the display region I, all of the color resist strips located in the peripheral area of the color filter substrate in the row direction consist of the color resists 1 in the non-display region II, and the color resist strips located in the central area of the color filter substrate in the row direction include the color resists 1 in the non-display region II and the color resists 1 in the display region I Since the second opening OP2 includes the second sub-opening S_OP2 provided in the color resist 1, an overall width of the second opening OP2 is larger than a width of the first opening OP1 even if a width of the gap between the adjacent color resists 1 in the non-display region II (that is, the first sub-opening) is the same as that of the gap between the adjacent color resists 1 in the display region I (that is, the first opening). Therefore, the first sub-opening S_OP1 and the first opening OP1 may have a same size according to the embodiment, which simplifies pattern complexity of masks.

The second sub-opening S_OP2 may be configured as a slot in the color resist I. The second sub-openings S_OP2 in the same column are integrally formed. As shown in FIG. 3, the slot may extend along a column direction, and penetrate through one end of the color resist strip.

As shown in FIG. 4, the second sub-opening S_OP2 is a through slot which penetrates the color resist I in a direction perpendicular to the color filter substrate.

Figure 5:
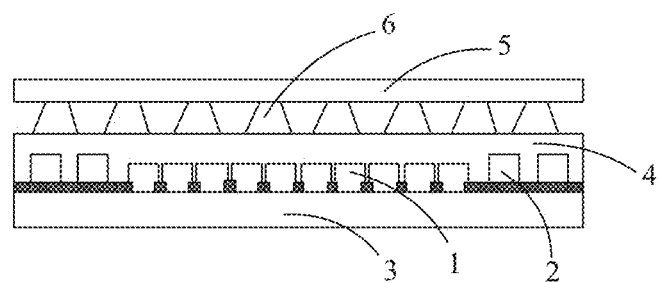
FIG. 5 is a schematic structural diagram of a display panel according to an embodiment of the present disclosure.

FIG. 5 is a schematic structural diagram of a display panel according to an embodiment of the present disclosure.

A display panel according to the embodiment may include the color filter substrate according to each embodiment of the present disclosure. It is shown in FIG. 5 that the display panel according to the embodiment includes the color filter substrate shown in FIG. 2, but the present disclosure is not limited thereto, so that the display panel according to the embodiment may include the color filter substrate shown in FIG. 4.

As shown in FIG. 5, the display panel according to the embodiment further includes an array substrate 5 disposed opposite to the color filter substrate, and spherical or cylindrical spacers 6 provided between the two substrates.

The embodiments of the present disclosure further provide a mask used for fabricating the color filter substrate according to each embodiment of the present disclosure. The mask may be used for preparing a color filter layer in the color filter substrate, and may include a first mask region corresponding to the display region of the color filter substrate and a second mask region corresponding to the non-display region of the color filter substrate. The first mask region is provided therein with a plurality of columns of third openings corresponding to color resists in the display region of the color filter substrate, and the second mask region is provided therein with a plurality of columns of fourth openings corresponding to color resists in the non-display region of the color filter substrate.

It should be understood that the foregoing implementations are merely exemplary implementations adopted for describing the principle of the present disclosure, but the present disclosure is not limited thereto. Those of ordinary skill in the art may make various variations and improvements without departing from the spirit and essence of the present disclosure, and these variations and improvements shall be considered to fall into the protection scope of the present disclosure.

What is claimed is:

1. A color filter substrate divided into a display region and a non-display region around the display region, comprising a base and a color filter layer on the base,
    wherein the color filter layer comprises a plurality of columns of color resists arranged at intervals,
    any two adjacent columns of color resists in the display region define one of a plurality of first openings,
    any two adjacent columns of color resists in the non-display region define one of a plurality of second openings, and
    a width of an orthographic projection of the second opening on the base is greater than a width of an orthographic projection of the first opening on the base,
    wherein the color resists in a same column are integrally formed; and in a row direction, a gap between and two adjacent columns of color resists in the display region defines the first opening, a gap between any two adjacent columns of color resists in the non-display region defines a first sub-opening, each color resist in the non-display region is provided with a second sub-opening, and each first sub-opening and one second sub-opening adjacent thereto form the second opening, and
    wherein the second sub-openings in a same column are integrally formed.

2. The color filter substrate of claim 1, wherein the color resists in a same column are integrally formed; and
    in a row direction, a gap between any two adjacent columns of color resists in the display region defines the first opening, and a gap between any two adjacent columns of color resists in the non-display region defines the second opening.

3. The color filter substrate of claim 1, wherein the first sub-openings and the first openings which are in a same column have a same size.

4. The color filter substrate of claim 1, wherein slots in the color resists in the non-display region define the second sub-openings.

5. The color filter substrate of claim 1, further comprising a black matrix layer between the base and the color filter layer.

6. The color filter substrate of claim 1, further comprising a planarization layer located on a side of the color filter layer away from the base.

7. A display panel, comprising the color filter substrate of claim 1.

8. The display panel of claim 7, wherein the color resists in a same column are integrally formed; and
    in a row direction, a gap between any two adjacent columns of color resists in the display region defines the first opening, and a gap between any two adjacent columns of color resists in the non-display region defines the second opening.

9. The display panel of claim 7, wherein the first sub-openings and the first openings which are in a same column have a same size.

10. The display panel of claim 7, wherein slots in the color resists in the non-display region define the second sub-openings.

11. The display panel of claim 7, wherein the color filter substrate further comprises a black matrix layer between the base and the color filter layer.

12. The display panel of claim 7, wherein the color filter substrate further comprises a planarization layer located on a side of the color filter layer away from the base.

13. The display panel of claim 7, further comprising an array substrate, and spacers provided between the color filter substrate and the array substrate.

* * * * *